(12) United States Patent
Rhodes

(10) Patent No.: US 6,825,516 B2
(45) Date of Patent: Nov. 30, 2004

(54) CMOS IMAGER AND METHOD OF FORMATION

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/342,313

(22) Filed: Jan. 15, 2003

(65) Prior Publication Data

US 2003/0138990 A1 Jul. 24, 2003

Related U.S. Application Data

(62) Division of application No. 10/213,085, filed on Aug. 7, 2002, which is a division of application No. 10/073,136, filed on Feb. 13, 2002, which is a division of application No. 09/941,556, filed on Aug. 30, 2001, now Pat. No. 6,504,196.

(51) Int. Cl.[7] .............................................. H01L 31/062
(52) U.S. Cl. ....................... 257/292; 257/227; 257/291; 257/439; 257/443; 257/444
(58) Field of Search ................................ 257/291, 292, 257/223, 227, 439, 443, 655

(56) References Cited

U.S. PATENT DOCUMENTS

| | | | |
|---|---|---|---|
| 5,245,203 A | 9/1993 | Morishita et al. | |
| 5,547,879 A | 8/1996 | Dierschke et al. | |
| 5,841,159 A | 11/1998 | Lee et al. | |
| 5,898,209 A | 4/1999 | Takakura | |
| 5,965,875 A | 10/1999 | Merrill | |
| 6,023,293 A | 2/2000 | Watanabe et al. | |
| 6,150,683 A | 11/2000 | Merrill et al. | |
| 6,198,139 B1 | 3/2001 | Ishida | |
| 6,198,147 B1 | 3/2001 | Connolly | |
| 6,225,670 B1 * | 5/2001 | Dierickx | 257/431 |
| 6,232,626 B1 | 5/2001 | Rhodes | |
| 6,242,313 B1 | 6/2001 | Hwang et al. | |
| 6,310,366 B1 | 10/2001 | Rhodes et al. | |
| 6,445,014 B1 | 9/2002 | Rhodes et al. | |
| 6,504,196 B1 | 1/2003 | Rhodes | |
| 6,608,338 B2 * | 8/2003 | Rhodes | 257/292 |

* cited by examiner

Primary Examiner—Wael Fahmy
Assistant Examiner—Wai-Sing Louie
(74) Attorney, Agent, or Firm—Dickstein Shapiro Morin & Oshinsky LLP

(57) ABSTRACT

A CMOS imager having an epitaxial layer formed below pixel sensor cells is disclosed. An epitaxial layer is formed between a semiconductor substrate and a photosensitive region to improve the cross-talk between pixel cells. The thickness of the epitaxial layer is optimized so that the collection of signal carriers by the photosensitive region is maximized.

22 Claims, 6 Drawing Sheets

CMOS IMAGER AND METHOD OF FORMATION

CROSS REFERENCE TO RELATED APPLICATIONS

The present application is a divisional application of U.S. patent application Ser. No. 10/213,085, filed on Aug. 7, 2002, which is a divisional of U.S. patent application Ser. No. 10/073,136 filed on Feb. 13, 2002, which in turn is a divisional of U.S. patent application Ser. No. 09/941,556, filed on Aug. 30, 2001, now U.S. Pat. No. 6,504,196, the disclosures of which are incorporated by reference herein.

FIELD OF THE INVENTION

The present invention relates to improved semiconductor imaging devices and, in particular, to CMOS imagers with improved color separation and sensitivity.

BACKGROUND OF THE INVENTION

The semiconductor industry currently uses different types of semiconductor-based imagers, such as charge coupled devices (CCDs), photodiode arrays, charge injection devices and hybrid focal plane arrays, among others.

CCD technology is often used for image acquisition and has a number of advantages which makes it the preferred technology, particularly for small size imaging applications. CCDs are capable of large formats with small pixel size and they employ low noise charge domain processing techniques. CCD imagers suffer, however, from a number of disadvantages. For example, they are susceptible to radiation damage, they exhibit destructive read-out over time, they require good light shielding to avoid image smear and they have a high power dissipation for large arrays. In addition, while offering high performance, CCD arrays are difficult to integrate with CMOS processing in part due to a different processing technology and to their high capacitances, complicating the integration of on-chip drive and signal processing electronics with the CCD array. Further, CCDs may suffer from incomplete charge transfer from pixel to pixel which results in image smear.

Because of the inherent limitations in CCD technology, CMOS imagers have been increasingly used as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

CMOS imagers have several advantages over CCD imagers, such as, for example, low voltage operation and low power consumption, compatibility with integrated on-chip electronics (control logic and timing, image processing, and signal conditioning such as A/D conversion), random access to the image data, and lower fabrication costs. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a doped region of a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the charge accumulation region of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

A schematic view of an exemplary CMOS imaging circuit is illustrated in FIG. 1. As it will be described below, the CMOS imaging circuit includes a photogate for accumulating photo-generated charge in an underlying portion of the substrate. It should be understood, however, that the CMOS imager may include a photodiode or other image to charge converting device, in lieu of a photogate, as the initial accumulator for photo-generated charge.

FIG. 1 shows a simplified photodetector circuit for a pixel cell 14 of an exemplary CMOS imager using a photogate and a readout circuit 60. It should be understood that while FIG. 1 shows the circuitry for operation of a single pixel, in practical use there will be an M×N array of pixels arranged in rows and columns with the pixels of the array accessed using row and column select circuitry, as described in more detail below.

The pixel cell 14 is shown in part as a cross-sectional view of a semiconductor substrate 16, which is typically a p-type silicon, having a surface well of p-type material 20. An optional layer 18 of p-type material may be used, if desired. Substrate 16 may be formed of Si, SiGe, Ge, or GaAs, among others. Typically, the entire semiconductor substrate 16 is a p-type doped silicon substrate including a surface p-well 20 (with layer 18 omitted), but many other options are possible, such as, for example p on p− substrates, p on p+ substrates, p-wells in n− type substrates or the like.

An insulating layer 22 of silicon dioxide, for example, is formed on the upper surface of p-well 20. The p-type layer may be a p-well formed in substrate 16. A photogate 24, thin enough to pass radiant energy or of a material which passes radiant energy, is formed on the insulating layer 22. The photogate 24 receives an applied control signal PG which causes the initial accumulation of pixel charges in n+ region 26. An n+ type region 26, adjacent to one side of the photogate 24, is formed in the upper surface of p-well 20. A transfer gate 28 is formed on insulating layer 22 between the n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. The n+ region 30 is also a node for passing charge accumulated thereat to the gate of a source follower transistor 36 described below.

A reset gate 32 is also formed on insulating layer 22 adjacent and between the n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source $V_{DD}$, of for example, 5 volts. The transfer and reset transistors 29, 31 are n-channel transistors as described in this implementation of a CMOS imager circuit in a p-well. As known in the art, it is also possible to implement a CMOS imager in an n-well, in which case each of the transistors would be p-channel transistors. It should also be noted that, while FIG. 1 shows the use of a transfer gate 28 and associated transistor 29, this structure provides advantages, but is not required.

Pixel cell 14 also includes two additional n-channel transistors, a source follower transistor 36 and a row select transistor 38. Transistors 36, 38 are coupled in series, source to drain, with the source of transistor 36 also coupled over lead 40 to voltage source $V_{DD}$ and the drain of transistor 38 coupled to a lead 42. The drain of the row select transistor 38 is connected via conductor 42 to the drains of similar row select transistors for other pixels in a given pixel row. A load transistor 39 is also coupled between the drain of transistor 38 and a voltage source $V_{SS}$, of for example 0 volts. Transistor 39 is kept on by a signal $V_{LN}$ applied to its gate.

The imager includes a readout circuit 60 (FIG. 1) which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage $V_{SS}$. The upper side of the capacitor 64 is also connected to the gate of a p-channel output transistor 66. The drain of the output transistor 66 is connected through a column select transistor 68 to a signal sample output node $V_{OUTS}$ and through a load transistor 70 to the voltage supply $V_{DD}$. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage $V_{SS}$. The upper side of the capacitor 74 is also connected to the gate of a p-channel output transistor 76. The drain of the output transistor 76 is connected through a p-channel column select transistor 78 to a reset sample output node $V_{OUTR}$ and through a load transistor 80 to the supply voltage $V_{DD}$. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by the reset transistor 31 and then of the stored charge from the photogate 24. The two samplings of the diffusion node 30 charges produce respective output voltages $V_{OUTR}$ and $V_{OUTS}$ of the readout circuit 60. These voltages are then subtracted ($V_{OUTS}-V_{OUTR}$) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in a manner similar to that of pixel cell 14 of FIG. 1. Pixel array 200 comprises a plurality of pixels arranged in a predetermined number of columns and rows. The pixels of each row in array 200 are all turned on at the same time by a row select line, such as line 86, and the pixels of each column are selectively output by a column select line, such as line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of pixel cell 14 of the CMOS imager of FIG. 1. The photogate signal PG is nominally set to 5V and pulsed from 5V to 0V during integration. The reset signal RST is nominally set at 2.5V. As illustrated in FIG. 3, the process begins at time $t_0$ by briefly pulsing reset voltage RST to 5V. The RST voltage, which is applied to the gate 32 of the reset transistor 31, causes transistor 31 to turn on and the floating diffusion node 30 to charge to the $V_{DD}$ voltage present at n+ region 34 (less the voltage drop $V_{TH}$ of transistor 31). This resets the floating diffusion node 30 to a predetermined voltage ($V_{DD}-V_{TH}$). The charge on the floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72, which charges capacitor 74 with the source follower transistor output voltage on line 42 representing the reset charge present at floating diffusion node 30. The PG signal is next pulsed to 0 volts, causing charge to be collected in n+ region 26.

A transfer gate voltage TX, similar to the reset pulse RST, is then applied to transfer gate 28 of transistor 29 to cause the charge in n+ region 26 to transfer to floating diffusion node 30. It should be understood that, for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

FIG. 4 shows a 2×2 portion of pixel array 200 illustrated schematically in FIG. 2. Pixel array 200 comprises a plurality of pixels arranged in a predetermined number of columns and rows. The pixels of each row in array 200 are all turned on at the same time by a row select line, for example, line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

Quantum efficiency is a problem in some imager applications due to the diffusion of signal carriers out of the photosite and into the substrate, where they become effectively lost. The loss of signal carriers results in decreased signal strength, increased cross-talk, and the reading of an improper value for the adjacent pixels.

There is needed, therefore, an improved pixel sensor cell for use in an imager that exhibits improved color separation, improved quantum efficiency, a better signal-to-noise ratio, and reduced cross-talk. A method of fabricating a pixel sensor cell exhibiting these improvements is also needed.

SUMMARY OF THE INVENTION

The present invention provides a method for improving the cross talk between pixel sensor cells of CMOS imagers. According to the present invention, optical cross-talk between pixel cells is improved by providing an epitaxial layer between the semiconductor substrate and the photosensitive region. The epitaxial layer induces an electric field which reflects signal carriers back to the photosensitive region. The thickness of the epitaxial layer may be optimized so that the collection of signal carriers by the photosensitive region and the photoresponse for different wavelengths are maximized.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

The term "well" refers to a doped region in a substrate where the peak concentration of the dopant is lower than that of the electrically active region of any device which may be eventually formed in the well.

Figure 5:
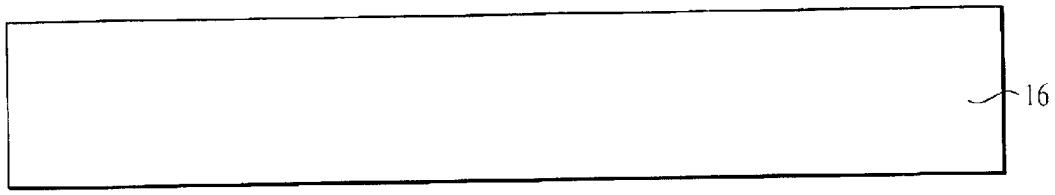
FIG. 5 is a cross-sectional and schematic view of a pixel cell fabricated in accordance with an embodiment of the present invention.

Referring now to the drawings, where like elements are designated by like reference numerals, FIGS. 5–8 illustrate an exemplary embodiment of a method of forming pixel cells 100 (FIG. 8) in a well formed in an epitaxial layer 160. FIG. 5 illustrates a substrate 16, which may be any of the types of substrates described above. Although reference to the substrate 16 will be made in this application as to a p-type silicon substrate 16, it must be understood that many other options are possible, for example, p on p– substrates, or p on p+ substrates, SOI substartes, or the like. Further, the invention has equal application to other semiconductor substrates, for example, silicon-germanium, germanium, silicon-on-saphire, or gallium-arsenide substrates, among many others.

Figure 6:
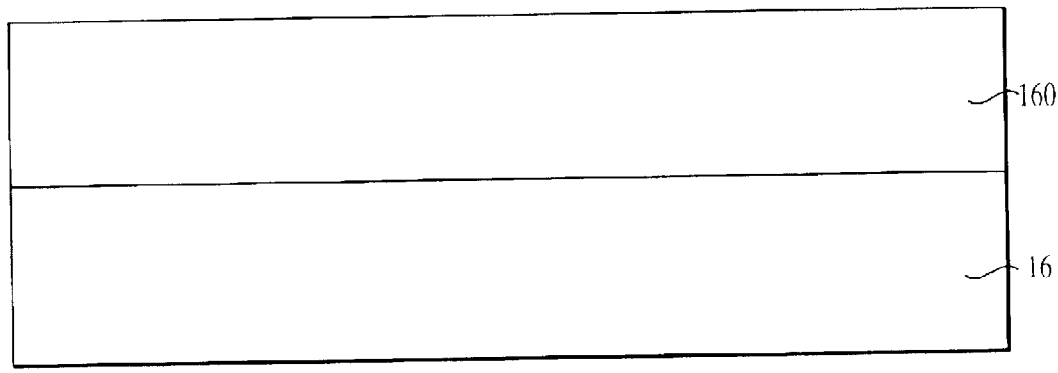
FIG. 6 is a cross-sectional view of the pixel cell of FIG. 4 at a stage of processing subsequent to that shown in FIG. 5.

Next, as illustrated in FIG. 6, an epitaxial layer 160 is formed over the p-type silicon substrate 16. The epitaxial layer 160 is of a first conductivity type, which for exemplary purposes is treated as p-type. Thus, in an exemplary embodiment of the invention, the epitaxial layer 160 is a p-type epitaxial layer 160 formed by a process such as liquid phase epitaxy (LPE), ultra high vacuum (UHV) chemical vapor deposition (CVD), vapor phase epitaxy (VPE), or metal organic vapor phase epitaxy (MOVPE), among others.

In an exemplary embodiment of the invention, the p-type epitaxial layer 160 (FIG. 6) is a p-type epitaxial silicon layer 160 which is grown by epitaxy in a reaction chamber at high temperatures, of about 900–1200° C., and by employing a silicon gas source that introduces a gaseous species containing silicon (Si) into the reaction chamber. As known in the art, the silicon gas source may be silane ($SiH_4$), higher order silanes, such as disilane ($Si_2H_6$), as well as other gaseous sources of silicon, such as dichlorsilane ($SiH_2Cl_2$), trichlorsilane ($SiHCl_3$), or tetrachlorsilane ($SiCl_4$). The p-type epitaxial silicon layer 160 (FIG. 6) is grown over the p-type silicon substrate 16 to a thickness of about 10,000 Angstroms to about 150,000 Angstroms, more preferably of about 30,000 Angstroms to about 100,000 Angstroms, and most preferably of about 60,000 Angstroms.

Although the above-mentioned thickness ranges are preferred, the invention is not limited to these values. In fact, and as it will be explained in more detail below, an important aspect of the invention is that the thickness of the p-type epitaxial silicon layer 160 may be tailored according to the device characteristics to control how signal carriers, for example photogenerated electrons, are collected in the photosensitive region of the CMOS imager. As explained in more detail below, by optimizing the thickness of the p-type epitaxial silicon layer 160, the collection of the signal carriers is maximized and the cross-talk between pixel cells is accordingly minimized.

Figure 7:
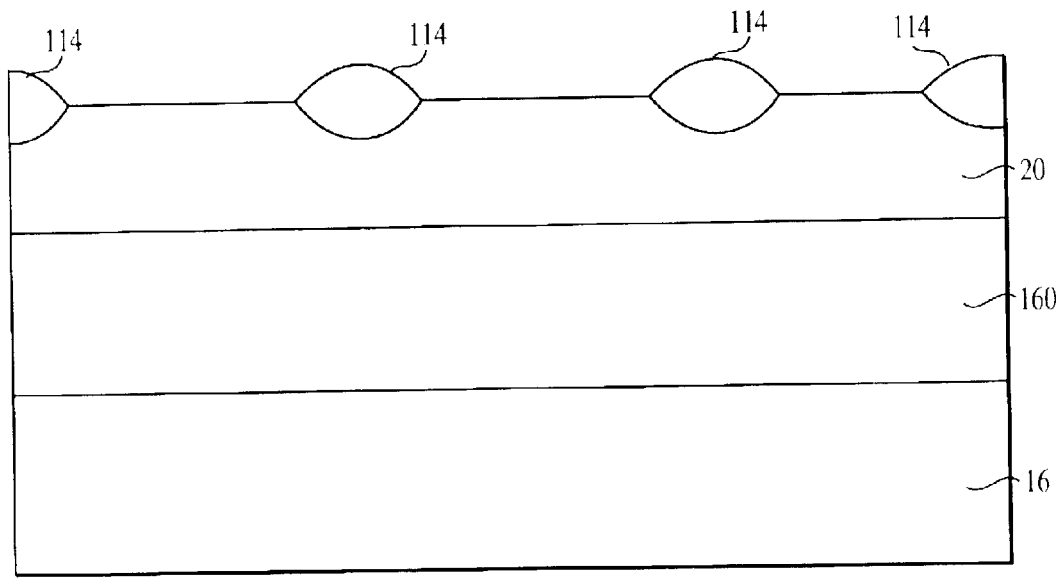
FIG. 7 is a cross-sectional view of the pixel cell of FIG. 4 at a stage of processing subsequent to that shown in FIG. 6.

Referring now to FIG. 7 and in accordance with an exemplary embodiment of the invention, a well 20 is formed in the p-type epitaxial silicon layer 160 and over the entire wafer by suitable means, for example blanket ion implantation. The layer or well 20 is of a first conductivity type, which, as mentioned above, is treated as p-type. Although the invention will be described with reference to the p-type epitaxial silicon layer 160 having well 20 formed therein, the invention is not limited to this exemplary embodiment, and it also contemplates the formation of the p-type epitaxial silicon layer 160 without a well formed therein. In addition, although the present invention will be described with the p-type well 20 formed after the formation of the p-type epitaxial silicon layer 160 and before the formation of the isolation regions, the p-type well 20 may be also implanted at a later stage of the process, for example after field oxide formation. The implant may be patterned so that the pixel array well and the periphery logic well, which contains logic circuits for transferring charge from the pixel array, could have different conductivities and/or doping profiles.

Ion implantation is performed by placing the p-type silicon substrate 16 in an ion implanter, and implanting appropriate dopant ions into the p-type epitaxial silicon layer 160 at an energy of 10 keV to 5 MeV to form p-type wells 20. In an exemplary embodiment of the present invention, the p-type well 20 is a retrograde p-type well having a dopant concentration that is lowest at the surface, and highest at the bottom of the well. According to this embodiment, the dopant concentration at the top of the p-type retrograde well 20 is within the range of about $5\times10^{14}$ to about $1\times10^{18}$ atoms per $cm^3$, and is preferably within the range of about $1\times10^{16}$ to about $1\times10^{17}$ atoms per $cm^3$, and most preferably is about $4\times10^{16}$ atoms per $cm^3$. At the bottom of the p-type well 20, the dopant concentration is within the range of about $1\times10^{16}$ to about $2\times10^{18}$ atoms per $cm^3$, and is preferably within the range of about $2\times10^{16}$ to about $1\times10^{18}$ atoms per $cm^3$, and most preferably is about $1\times10^{17}$ atoms per $cm^3$. If the retrograde well 20 is to be a p-type well, a p-type dopant, such as boron, or indium is implanted, and if the retrograde well 20 is to be an n-type well, an n-type dopant, such as arsenic, antimony, or phosphorous is implanted. The resultant structure is shown in FIG. 7. Multiple high energy implants may be used to tailor the dopant profile of the p-type well 20.

Also illustrated in FIG. 7 are field oxide regions 114 which may be formed around later formed pixel cells 100, and according to an embodiment of the invention, after the formation of the p-type well 20. The field oxide regions are formed by any known technique such as thermal oxidation of the underlying silicon in a LOCOS process or by etching trenches and filling them with oxide in an STI process. Following field oxide 114 formation, if the p-type well 20 has not yet been formed, it may then be formed by blanket implantation or by masked implantation to produce the well 20 shown in FIG. 7.

Figure 8:
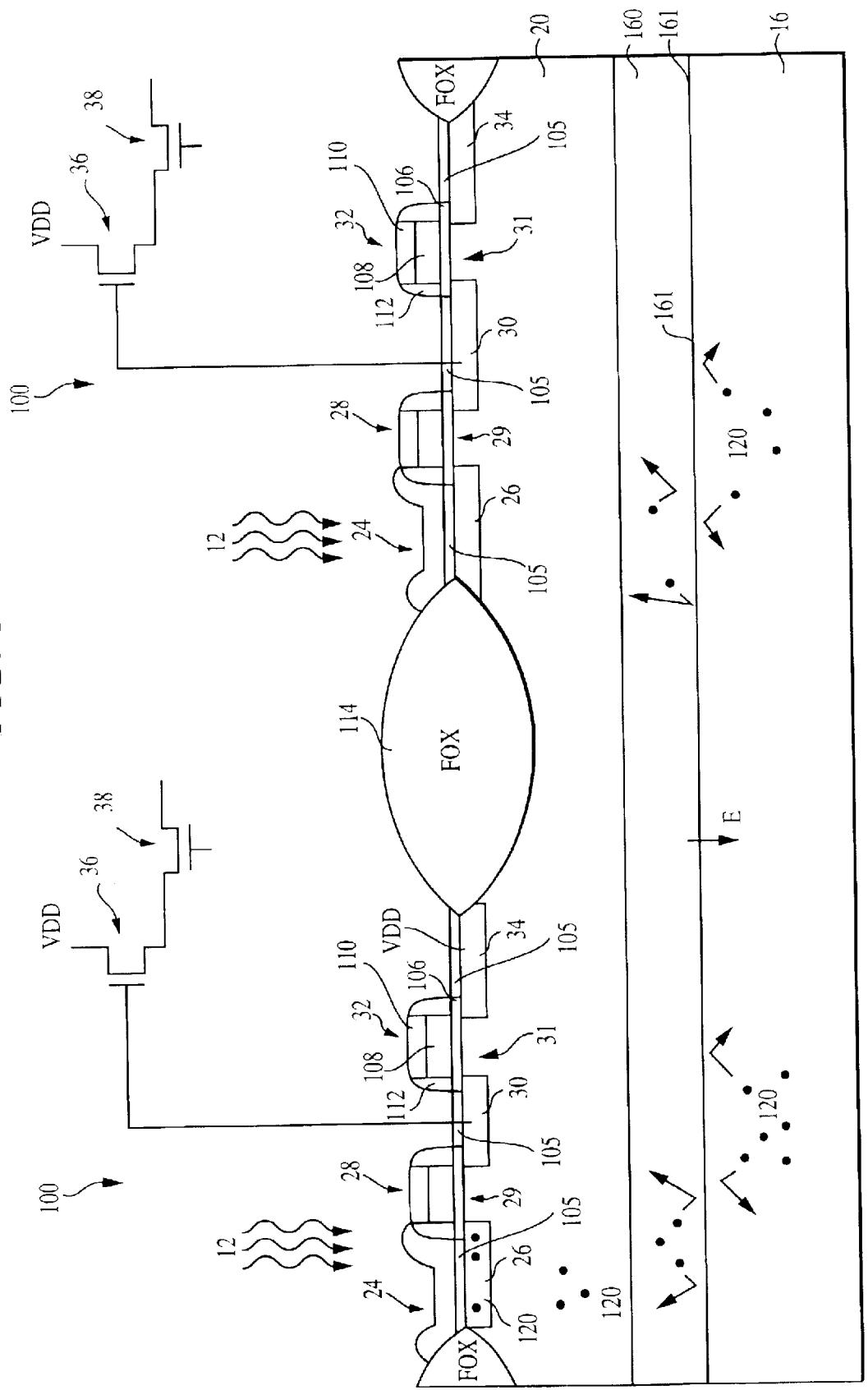
FIG. 8 is a cross-sectional view of the pixel cell of FIG. 4 at a stage of processing subsequent to that shown in FIG. 7.

Subsequent to formation of the p-type well 20 and of the field oxide regions 114, the devices of the pixel sensor cell 100 (FIG. 8), including the photogate 24, the transfer gate 28, reset transistor 31, the source follower 36 and the row select transistor 38 are formed by well-known methods, all being depicted in FIG. 8. Doped regions 26, 30, and 34 are formed in the p-type well 20, and are doped to a second conductivity type, which for exemplary purposes will be considered to be n-type. The doping level of the doped regions 26, 30, 34 may vary but should be higher than the doping level at the top of the p-type well 20, and greater than $5\times10^{16}$ atoms per $cm^3$. If desired, multiple masks and resists may be used to dope these regions to different levels. Doped region 26 may be variably doped, such as either n+ or n− for an n-channel device. Doped region 34 should be strongly doped, i.e., for an n-channel device, the doped region 34 will be doped as n+. Doped region 30 is typically strongly doped (n+), and would not be lightly doped (n−) unless a buried contact is also used.

The single p-type epitaxial silicon layer 160 with the p-type well 20 formed therein spans all pixels in the array of pixels, as depicted in FIG. 8. A second epitaxial layer with a second n- or p-type well (not shown) may be formed in the substrate 16, and may contain the peripheral circuitry such as, for example, logic circuitry formed therein. This second well may be doped similarly or differently from the first retrograde well 20.

The transistor gates forming the pixel cell 100 are a photogate 24, a transfer gate 28 for transfer transistor 29, and a reset transistor gate 32 for the reset transistor 31. In addition, the photosensitive element in the pixel cell 100 is shown to be a photogate 24, but other photosensitive elements such as a photodiode or a photoconductor could be used. The transfer gate 28 and the reset gate 32 include a gate oxide layer 106 on the p-type well 20, and a conductive layer 108 of doped polysilicon, tungsten, or other suitable material over the gate oxide layer 106. An insulating cap layer 110 of, for example, silicon dioxide, silicon nitride, or ONO (oxide-nitride-oxide), may be formed if desired; also a more conductive layer such as a silicide layer (not shown) may be used between the conductive layer 108 and the cap 110 of the transfer gate stack 28, source follower gate, row select gate, and reset gate stack 32, if desired. Insulating sidewalls 112 are also formed on the sides of the gate stacks 28, 32. These sidewalls may be formed of, for example, silicon dioxide or silicon nitride or ONO. The transfer gate 28 and/or transfer transistor 29 are not required but may advantageously be included. If they are omitted, doped region 26 connects with doped region 30. The photogate 24 is a semitransparent conductor and is shown as an overlapping gate. In this case there is a second gate oxide 105 over the well and under the photogate.

Underlying the photogate 24 is the doped region 26 called the photosite, where photogenerated charges are stored. In between the reset transistor gate 32 and the transfer gate 28 is a doped region 30 that is the source for the reset transistor 31, and on the other side of the reset transistor gate 32 is a doped region 34 that acts as a drain for the reset transistor 31. The doped regions 26, 30, 34 are doped to a second conductivity type, which for exemplary purposes is treated as n-type. The second doped region 30 is the floating diffusion region, sometimes also referred to as a floating diffusion node. The third doped region 34 is connected to voltage source Vdd.

As shown in FIG. 8, as light radiation 12 in the form of photons strikes the photosite 26, photo-energy is converted to electrical signals, for example, carriers 120, which are stored in the photosite 26. The absorption of light creates electron-hole pairs. For the case of an n-doped photosite in a p-well, it is the electrons that are stored. For the case of a p-doped photosite in an n-well, it is the holes that are stored. In the exemplary pixel cell 100 of FIG. 8 having n-channel devices formed in the p-type epitaxial layer 160, the carriers 120 stored in the photosite 26 are electrons.

The p-type epitaxial layer 160 acts to reduce carrier loss to the substrate 16 by forming a concentration gradient that modifies the band diagram and serves to reflect electrons back towards the photosite 26, thereby increasing quantum efficiency of the pixel 100. The formation of the p-type epitaxial layer 160 increases the dopant concentration at interface 161 (FIG. 8), defined as the interface between the p-type epitaxial layer 160 and the p-type silicon substrate 16. The increase of p-type dopant concentration at the interface 161 further results in an electric field E (FIG. 8) directed away from the surface of the pixel sensor cell 100 and which acts as a reflective barrier for the electrons or carriers 120 in substrate 16. Thus, if the p-type epitaxial layer 160 is chosen to have a thickness of about 80,000 Angstroms, red light, which is typically absorbed deep in the silicon substrate, will be absorbed at about the epitaxial layer 160/silicon substrate 16 interface 161. Because the increased doping concentration at this interface creates a strong electric field, the red photogenerated electrons are reflected back towards the surface of the p-type silicon substrate 16 and the photosite 26.

Similarly, if the p-type epitaxial layer 160 is chosen to have a thickness of about 10,000 Angstroms, blue light, which is typically absorbed close to the surface of the silicon surface, will be absorbed at the epitaxial layer 160/silicon substrate 16 interface 161 and, thus, close to the surface of the p-type silicon substrate 16. Again, the increased doping concentration at the interface 161 creates an electric field which reflects back blue photogenerated electrons towards the surface of the p-type silicon substrate 16 and the photosite 26. This way, by adjusting the thickness of the p-type epitaxial layer 160 for respective color pixel cells, the photogenerated electrons corresponding to a particular color wavelength are reflected back to the photosite 26, the collection of such photogenerated electrons is maximized and, accordingly, the cross-talk between pixel cells is minimized.

Figure 1:
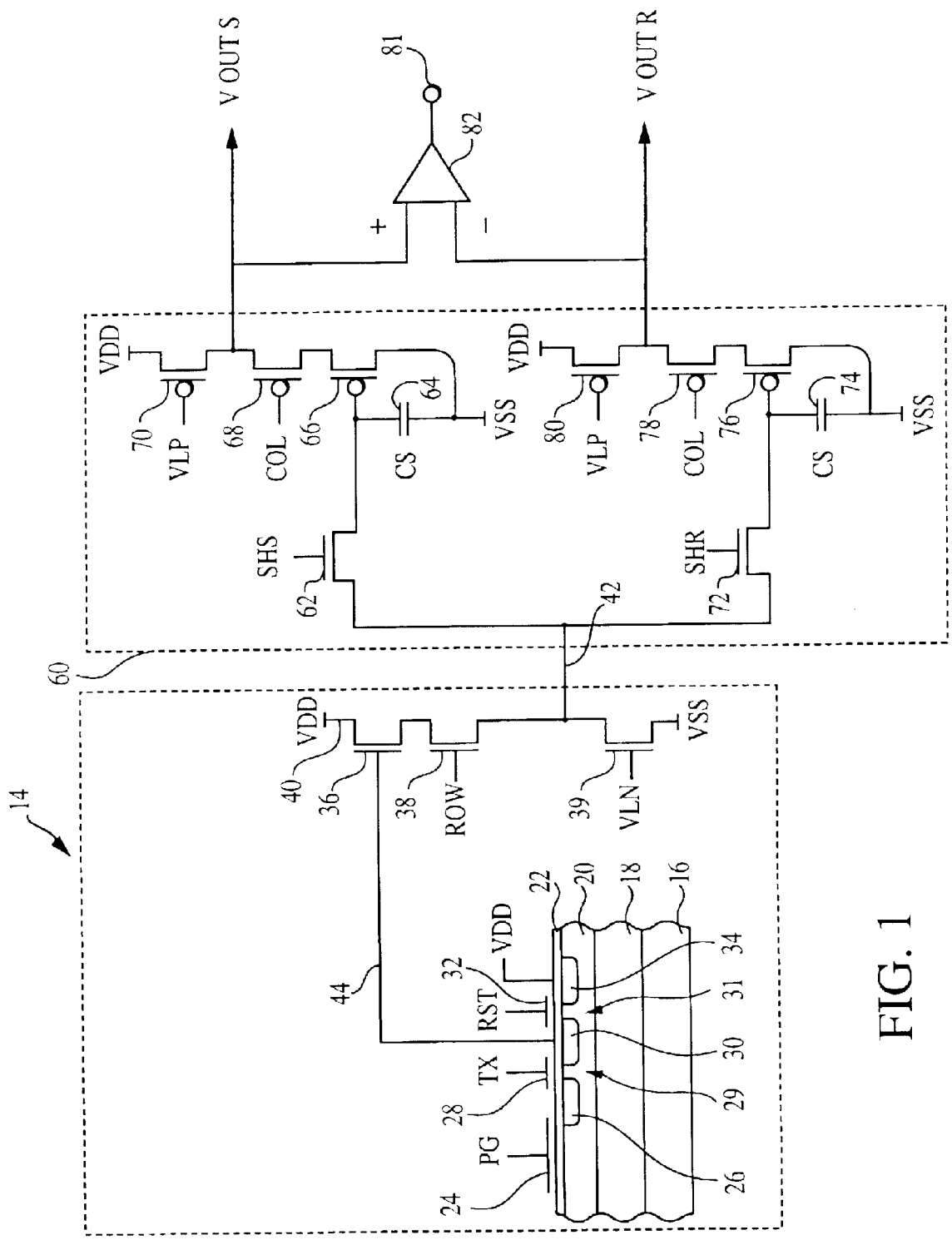
FIG. 1 is a representative circuit of a active pixel cell of a CMOS imaging system.
Figure 2:
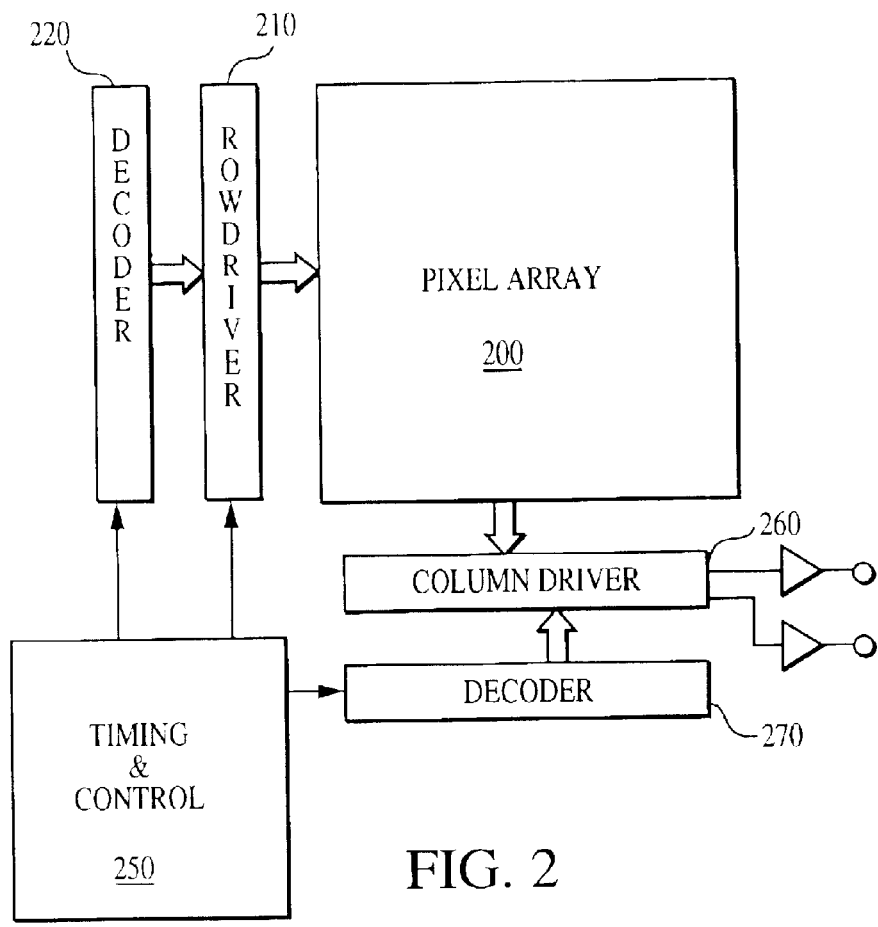
FIG. 2 is a block diagram of a CMOS pixel sensor chip.
Figure 3:
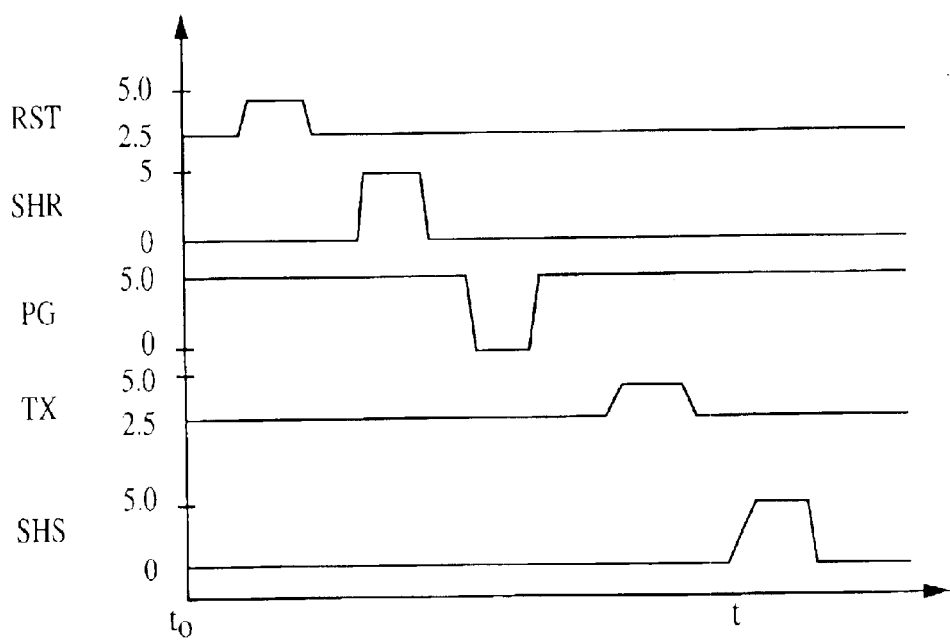
FIG. 3 is a representative timing diagram of a CMOS imager.
Figure 4:
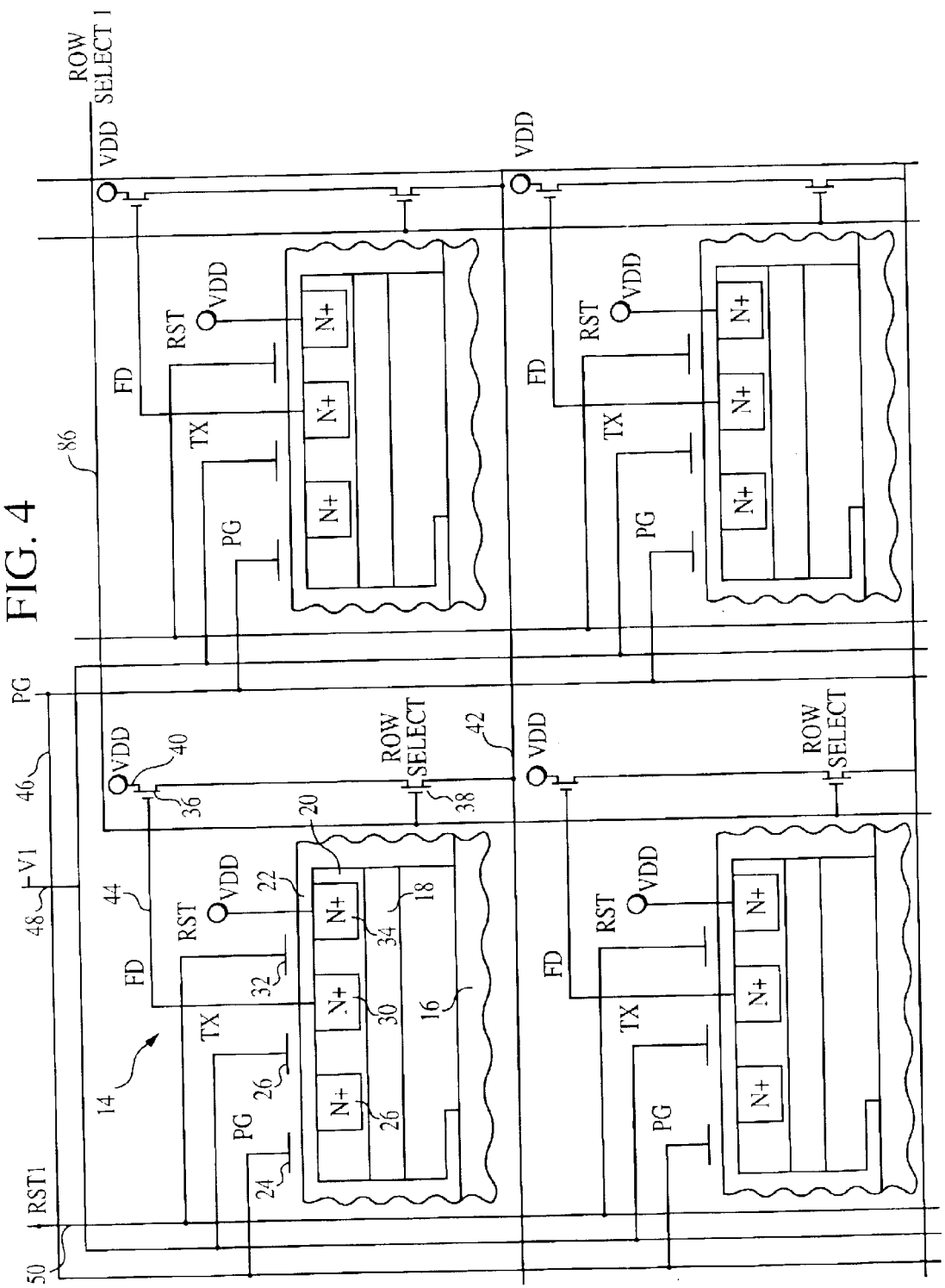
FIG. 4 is a cross-sectional and schematic view of a color pixel.

The pixel sensor cell 100 is essentially complete at this stage, and conventional processing methods may be used to form contacts and wiring to connect gate lines and other connections in the pixel cell 100. For example, the entire surface may then be covered with a passivation layer of, for example, silicon dioxide, BSG, PSG, or BPSG, which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 9:
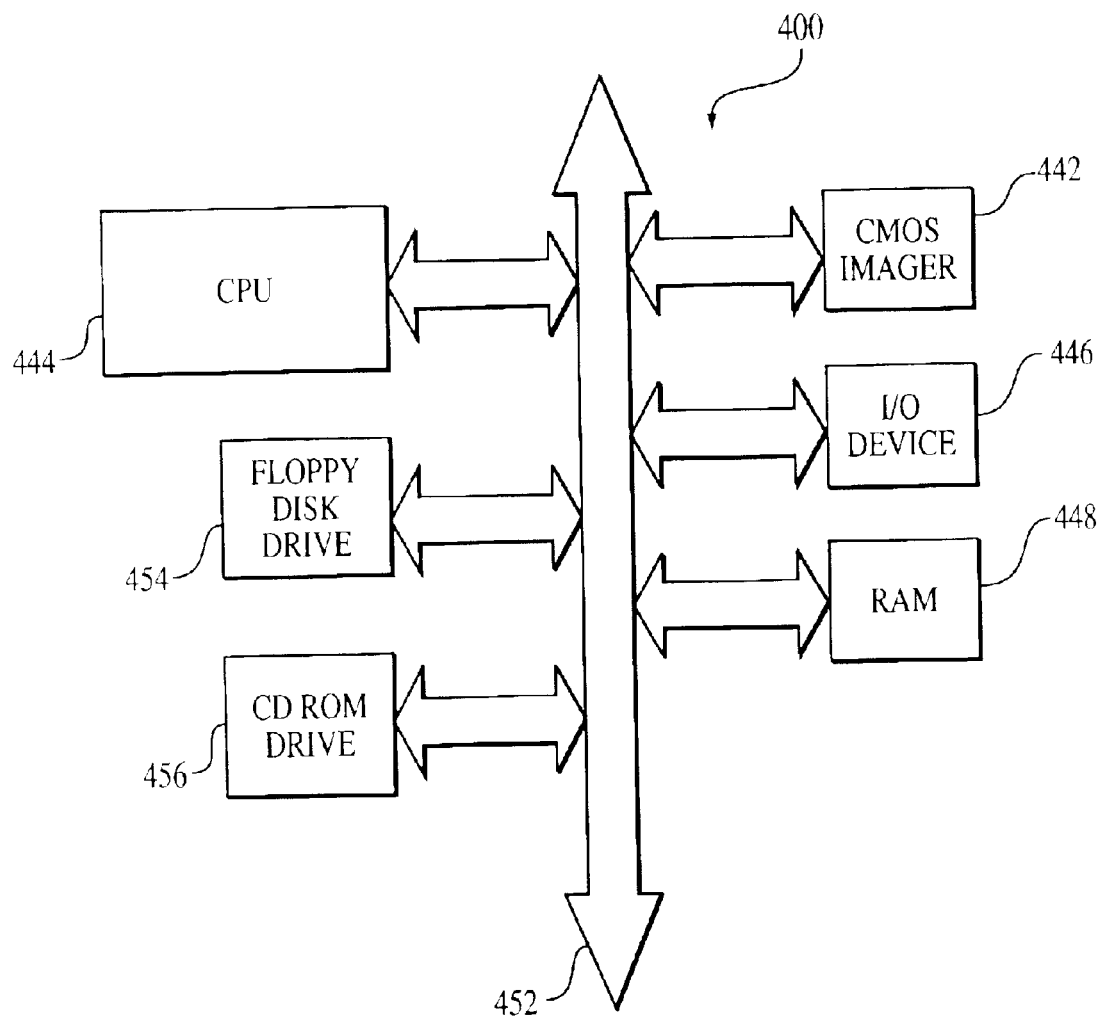
FIG. 9 is an illustration of a computer system having a CMOS imager with pixel cells formed according to the present invention.

A typical processor based system which includes a CMOS imager device according to the present invention is illustrated generally at 400 in FIG. 9. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444, for example, a microprocessor, that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing a photosensor, such as a photogate or photodiode, formed in an epitaxial layer, as previously described with respect to FIGS. 5–8. The CMOS imager 442 may be combined with a processor, such as a CPU, digital signal processor or microprocessor, with or without memory storage in a single integrated circuit, or may be on a different chip than the processor.

The present invention encompasses a pixel sensor cell formed in an epitaxial layer. The pixel sensor cell has improved quantum efficiency and an improved signal-to-noise ratio due to the presence of a doping gradient induced electric field created in the bottom of the epitaxial layer which reflects signal carriers back to the photosensitive node. By reflecting photogenerated carriers back to the storage node, the epitaxial layer also reduces the number of carriers diffusing to adjacent pixels and so also reduces cross-talk.

It should again be noted that although the invention has been described with specific reference to CMOS imaging circuits having a photogate and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A color pixel cell for an imaging device, said color pixel cell comprising:

a first, second and third epitaxial layers of a first conductivity type formed in a substrate, said first, second and third epitaxial layers having different thicknesses in said substrate;

a first, second and third photosensitive regions formed in said respective first, second and third epitaxial layers for receiving first, second and third photocharges corresponding to a particular color wavelength; and a first, second and third floating diffusion regions of a second conductivity type formed in said respective first, second and third epitaxial layers for receiving said respective photocharges transferred from said respective first, second and third photosensitive regions.

2. The color pixel cell of claim 1, wherein said first epitaxial layer, said first photosensitive region and said first floating diffusion region correspond to a red sensor cell of said imaging device.

3. The color pixel cell of claim 1, wherein said second epitaxial layer, said second photosensitive region and said second floating diffusion region correspond to a blue sensor cell of said imaging device.

4. The color pixel cell of claim 1, wherein said third epitaxial layer, said third photosensitive region and said third floating diffusion region correspond to a green sensor cell of said imaging device.

5. The color pixel cell of claim 1, wherein said first conductivity type is p-type, and said second conductivity type is n-type.

6. The color pixel cell of claim 5, wherein said first epitaxial layer is a p-type epitaxial silicon layer and is for a red sensor cell.

7. The color pixel cell of claim 6, wherein said second epitaxial layer is a p-type epitaxial silicon layer and is for a blue sensor cell.

8. The color pixel cell of claim 7, wherein said third epitaxial layer is a p-type epitaxial silicon layer and is for a green sensor cell.

9. The color pixel cell of claim 1, wherein said first conductivity type is n-type, and said second conductivity type is p-type.

10. The color pixel cell of claim 1, wherein each of said respective first, second and third photosensitive regions further comprises a respective photosensor for controlling the collection of charges in said photosensitive region.

11. The color pixel cell of claim 10, wherein each of said photosensor is a photodiode sensor.

12. The color pixel cell of claim 10, wherein each of said photosensor is a photogate sensor.

13. A color pixel cell for an imaging device, said color pixel cell comprising:

at least three epitaxial layers of a first conductivity type formed in a substrate, said at least three epitaxial layers having different thicknesses in said substrate;

at least three photosensitive regions formed in said respective at least three epitaxial layers for receiving at least three photocharges corresponding to a particular color wavelength; and at least three floating diffusion regions of a second conductivity type formed in said respective at least three epitaxial layers for receiving said respective phtocharges transferred from said respective at least three photosensitive regions.

14. The color pixel cell of claim 13, wherein each of said at least three epitaxial layers, of said at least three photosensitive regions and of said at least three floating diffusion regions correspond to a particular color sensor cell of said imaging device.

15. The color pixel cell of claim 13, wherein said first conductivity type is p-type, and said second conductivity type is n-type.

16. The color pixel cell of claim 13, wherein one of said at least three epitaxial layers is a p-type epitaxial silicon layer and is for a red sensor cell.

17. The color pixel cell of claim 13, wherein one of said at least three epitaxial layers is a p-type epitaxial silicon layer and is for a blue sensor cell.

18. The color pixel cell of claim 13, wherein one of said at least three epitaxial layers is a p-type epitaxial silicon layer and is for a green sensor cell.

19. The color pixel cell of claim 13, wherein said first conductivity type is n-type, and said second conductivity type is p-type.

20. The color pixel cell of claim 13, wherein each of said respective at least three photosensitive regions further comprises a respective photosensor for controlling the collection of charges in said photosensitive region.

21. The color pixel cell of claim 20, wherein each of said photosensor is a photodiode sensor.

22. The color pixel cell of claim 20, wherein each of said photosensor is a photogate sensor.

* * * * *

UNITED STATES PATENT AND TRADEMARK OFFICE
CERTIFICATE OF CORRECTION

PATENT NO. : 6,825,516 B2
DATED : November 30, 2004
INVENTOR(S) : Howard E. Rhodes It is certified that error appears in the above-identified patent and that said Letters Patent is hereby corrected as shown below:

Column 1,
Line 1, "CM OS" should read -- CMOS --.

Column 12,
Lines 13-14, "phto-charges" should read -- photo-charges --.

Signed and Sealed this

Twenty-ninth Day of November, 2005

JON W. DUDAS
*Director of the United States Patent and Trademark Office*